United States Patent
Xie et al.

(10) Patent No.: US 8,305,107 B2
(45) Date of Patent: Nov. 6, 2012

(54) SYSTEM FOR TESTING A POWER SUPPLY UNIT

(75) Inventors: Ling-Yu Xie, Shenzhen (CN); Sheng-Chung Huang, Taipei Hsien (TW); Kun-Lung Wu, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 536 days.

(21) Appl. No.: 12/557,531

(22) Filed: Sep. 11, 2009

(65) Prior Publication Data

US 2010/0315749 A1     Dec. 16, 2010

(30) Foreign Application Priority Data

Jun. 11, 2009   (CN) .......................... 2009 1 0303153

(51) Int. Cl.
*G01R 31/40* (2006.01)
(52) U.S. Cl. .................. 324/764.01; 324/685; 702/132; 702/108; 702/130
(58) Field of Classification Search ........... 702/132; 324/685
See application file for complete search history.

(56) References Cited

U.S. PATENT DOCUMENTS

| | | | | |
|---|---|---|---|---|
| 4,037,156 A * | 7/1977 | Goujon et al. | ........... | 324/764.01 |
| 4,438,498 A * | 3/1984 | Sekel et al. | ........... | 702/60 |
| 6,014,611 A * | 1/2000 | Arai et al. | ........... | 702/132 |
| 6,388,853 B1 * | 5/2002 | Balakrishnan et al. | ........... | 361/93.9 |
| 6,442,498 B1 * | 8/2002 | Krigel | ........... | 702/108 |
| 6,665,163 B2 * | 12/2003 | Yanagisawa | ........... | 361/103 |
| 6,957,161 B2 * | 10/2005 | Allen et al. | ........... | 702/108 |
| 7,058,484 B1 * | 6/2006 | Potega | ........... | 700/297 |
| 7,340,367 B2 * | 3/2008 | Inoue et al. | ........... | 702/132 |
| 7,355,362 B2 * | 4/2008 | Pai et al. | ........... | 318/432 |
| 7,490,479 B2 * | 2/2009 | Byquist et al. | ........... | 62/178 |
| 2008/0296009 A1 * | 12/2008 | Ziarnik et al. | ........... | 165/287 |
| 2011/0085927 A1 * | 4/2011 | Su | ........... | 417/423.14 |

* cited by examiner

*Primary Examiner* — Richard Isla Rodas
(74) *Attorney, Agent, or Firm* — Altis Law Group, Inc.

(57) ABSTRACT

A system for testing a power supply unit includes a test sub-system and a test control sub-system connected to the test sub-system and the power supply unit. The test sub-system perform tests and record the results. The test control sub-system is capable of selecting test items to test the power supply unit and setting an execution sequence of the test items. The test items includes a standby test item for testing the power supply unit at a standby state, a normal test item for testing the power supply unit at a normal state, and an over temperature protection test item for testing the power supply unit at an over heated state. The test control sub-system is further capable of automatically switching the standby test item to the normal test item, and switching the normal test item to the over temperature protection test item.

17 Claims, 5 Drawing Sheets

SYSTEM FOR TESTING A POWER SUPPLY UNIT

BACKGROUND

1. Technical Field

The present disclosure relates to testing systems, and more particularly to a system for testing a power supply unit.

2. Description of Related Art

A power supply unit is very important in a computer for supplying power to each part of the computer and ensuring normal running of the parts in the computer. Therefore, before the power supply unit is applied to the computer, it's necessary to strictly test performance of the power supply unit.

There are three test items for testing the power supply unit. The three test items are a standby (SB) test item, a normal test item, and an OTP (over temperature protection) test item. In the SB test, the power supply unit is supplied with an external AC (Alternating Current) source and in a standby state; a PSON (Power Supply on) signal on the power supply unit is at a high level, and the power supply unit is powered off and just generates some standby voltages (such as +5VSB). In the normal test, the external AC source is switched on or off, and the power supply unit is tested to ensure whether it conforms to the authoritative standard specified standards. In the over temperature protection test, the power supply is tested under an over heated condition to ensure that the power supply unit can shut down automatically to protect the power supply from overheating.

For testing the power supply unit, a typical test system is utilized. The test system includes a computer, a DC (direct current) load connected to the power supply unit, an AC source supplied to the power supply unit, and a chamber for accommodating the power supply unit therein and providing a required ambient temperature to the power supply unit. The typical system can test the power supply unit and record test results. However, utilizing the typical test system to test the power supply unit needs an operator to switch test items after an appropriate time period. The operator has to monitor and control the apparatus of the typical test system himself/herself. This is inconvenient. Therefore there is room for improvement in the art to alleviate or mitigate this inconvenience.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
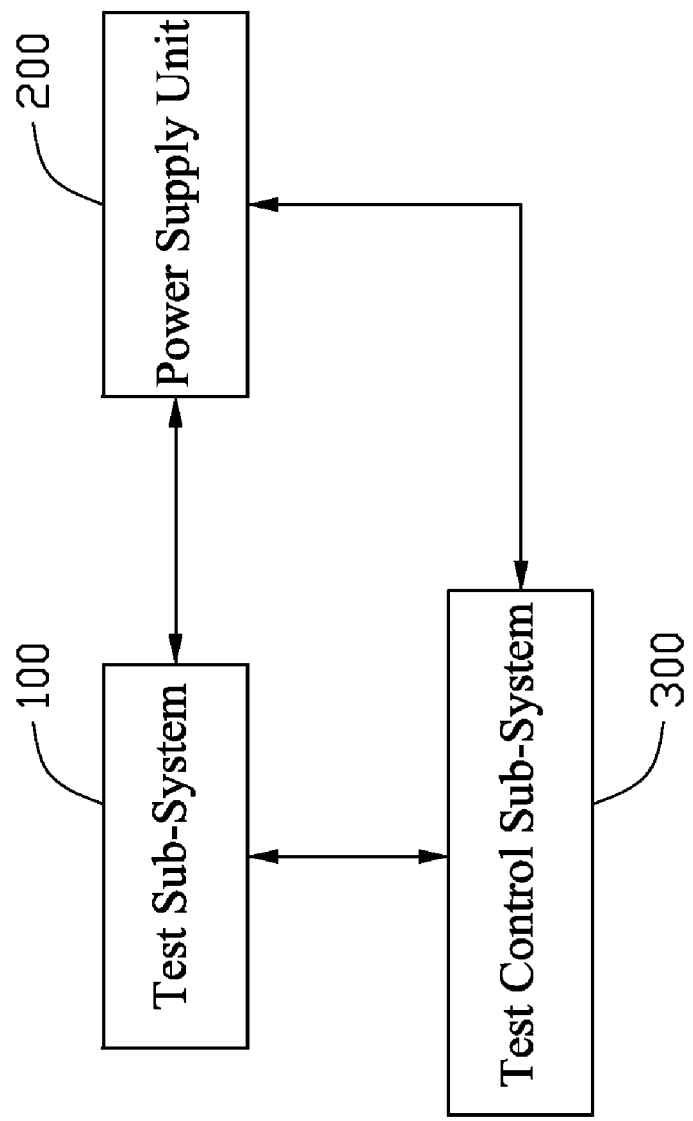
FIG. 1 is a block diagram of a system for testing a power supply unit in accordance with an embodiment of the present disclosure.

Referring to FIG. 1, an embodiment of a system for testing a power supply unit (PSU) 200 includes a test sub-system 100, and a test control sub-system 300. The test sub-system 100 can test the PSU 200 and record test results. The test sub-system 100 includes a computer, a direct current (DC) load, an alternate current (AC) source, and a chamber capable of providing a required ambient temperature and accommodating the PSU 200 therein. The test control sub-system 300 includes integrated hardware and software. The test control sub-system 300 is capable of selecting test items and predetermining an execution sequence of the test items, thereby the test items can be executed automatically according to the predetermined sequence. The test items includes a SB test item to test the PSU 200 in a standby state, a normal test item to test the power supply unit 200 in a normal state, and an OTP (over temperature protection) test item to test the PSU 200 in an over heated state. The test control sub-system 300 is capable of switching from one of the test items to another after a predetermined time period.

Figure 2:
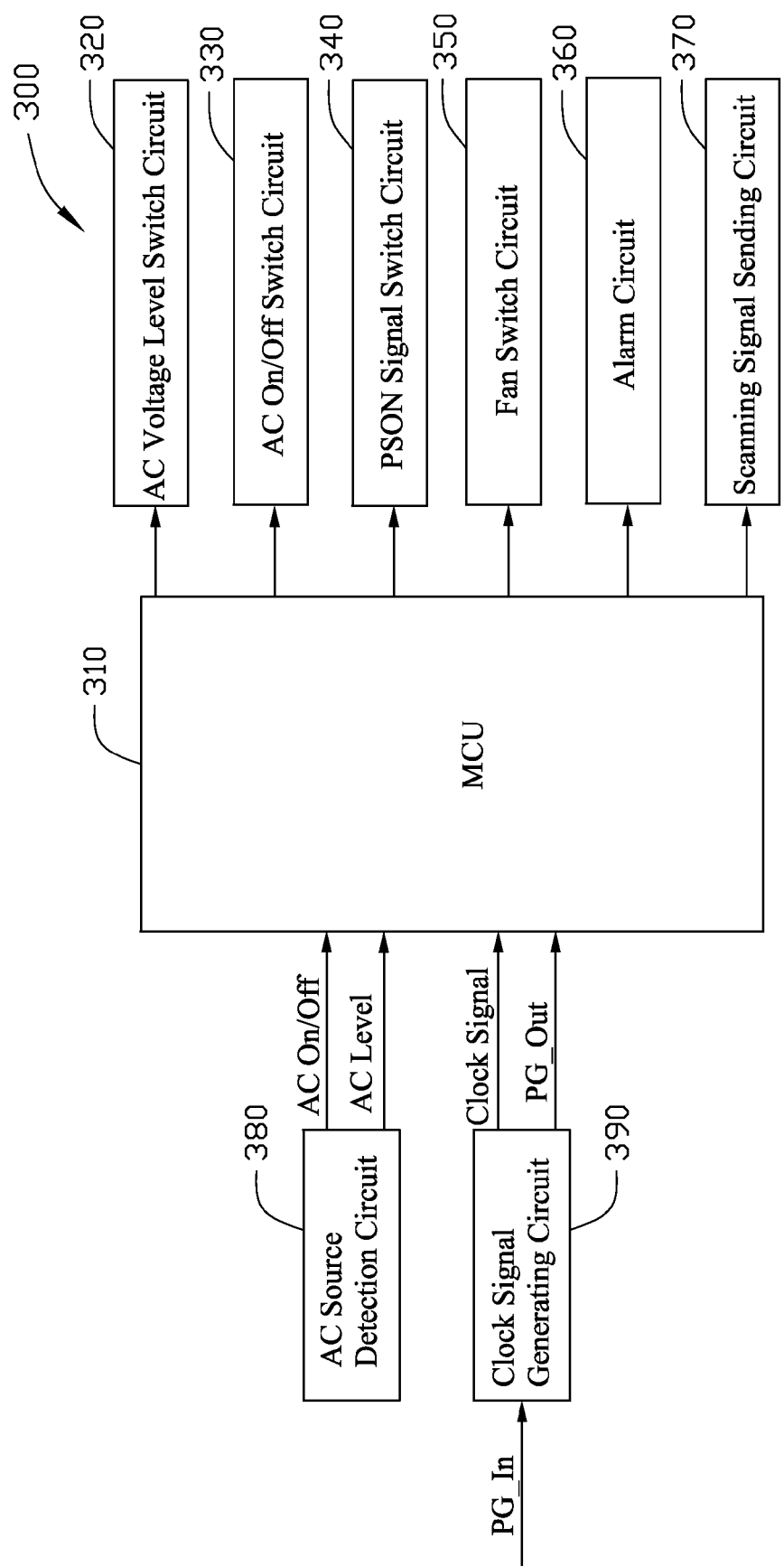
FIG. 2 is a block diagram of a test control sub-system of the testing system of FIG. 1.

Referring to FIG. 2, the test control sub-system 300 includes a microcontroller unit (MCU) 310 integrated with a central processing unit (CPU), a random access memory (RAM), a read only memory (ROM), a timing counter, an I/O interface. The MCU 310 is configured for automatically testing the PSU 200.

The MCU 310 is connected to an AC voltage level switch circuit 320, an AC On/Off switch circuit 330, a PSON (Power Supply On) signal switch circuit 340, a fan switch circuit 350, an alarm circuit 360, and a scanning signal sending circuit 370. The MCU 310 is capable of sending control signals to control the external circuits 320, 330, 340, 350, 360, 370 as described above.

The MCU 310 is further connected to an AC source detection circuit 380 and a clock signal generating circuit 390. The AC source detection circuit 380 is capable of sending signals to the MCU 310 via its two output terminals to signal the MCU 310 that an AC source supplied to the PSU 200 is switched on or off and a voltage level of the AC source supplied to the PSU 200 is at a second high level (90V or 115V) or a second level (264V or 230V). The clock signal generating circuit 390 is capable of sending clock signals and an amplified Power Good (PG) signal to the MCU 310.

Figure 3:
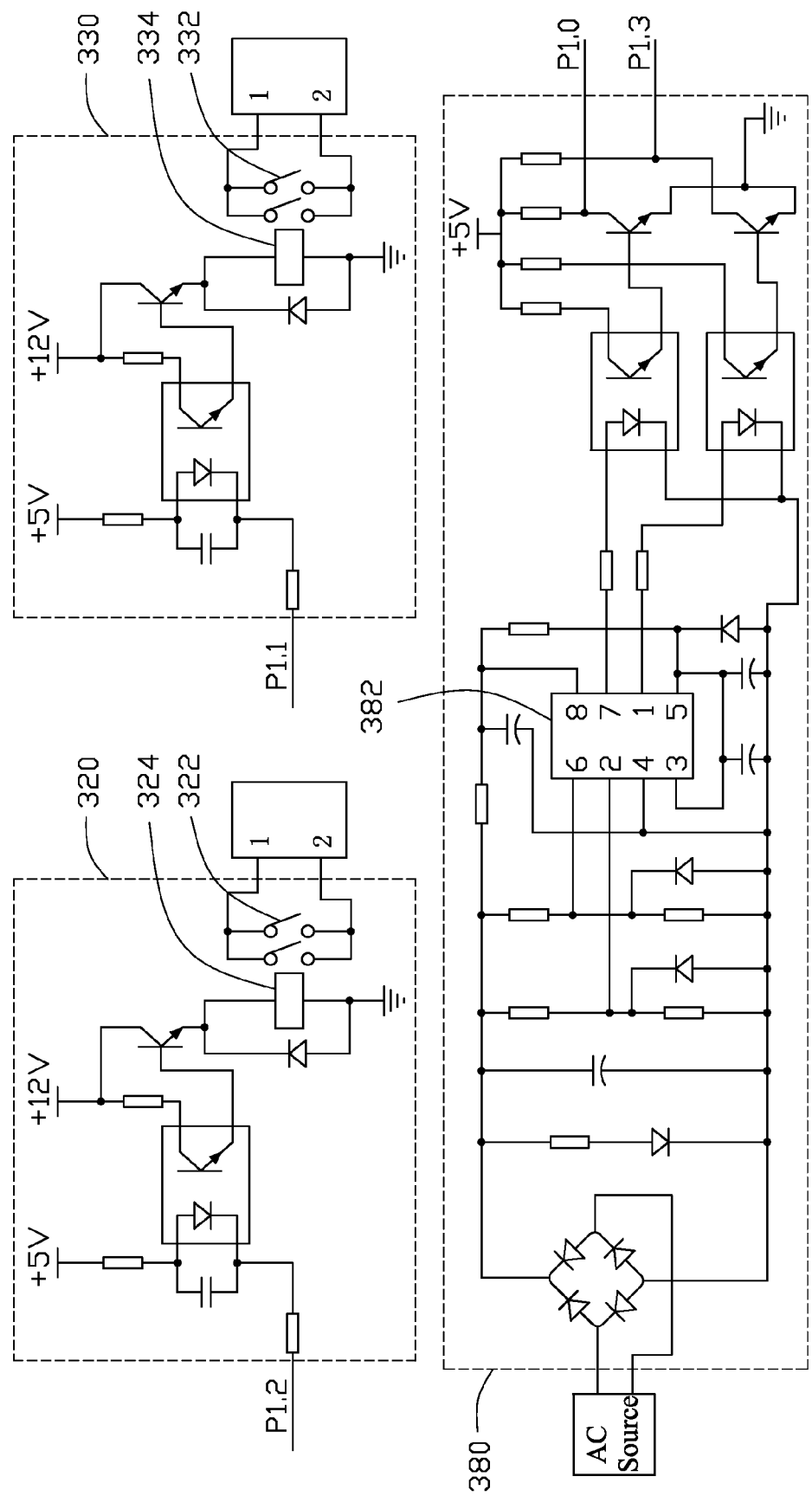
FIG. 3 is a part of a circuit of a test control sub-system of the testing system of FIG. 2.
Figure 4:
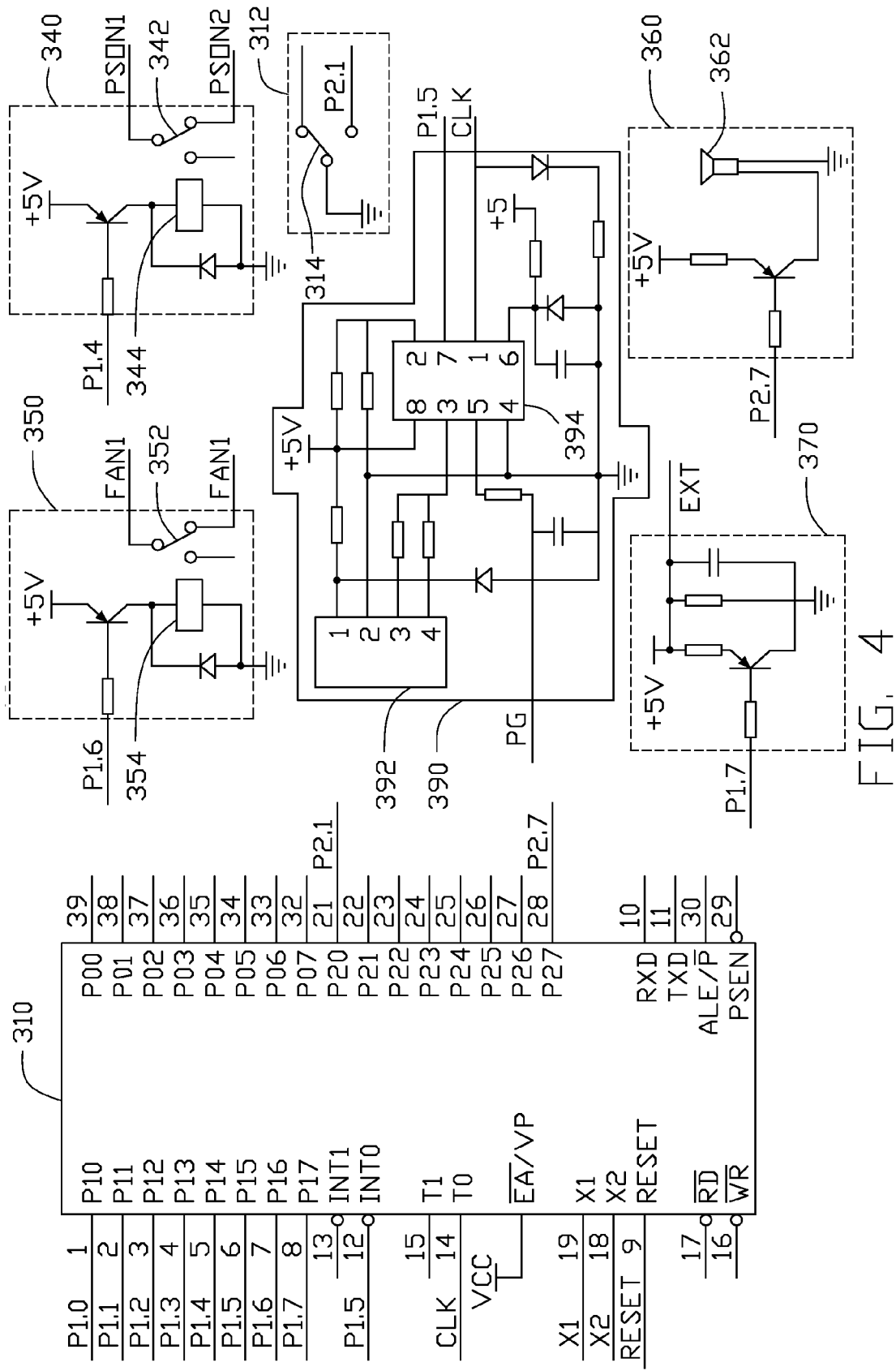
FIG. 4 is another part of the circuit of the test control sub-system in FIG. 2.

Referring to FIGS. 3 and 4, the AC source detection circuit 380 includes a first chip 382. The chip 382 is an LM358 chip and includes two integrated amplifiers. Each of the amplifiers is capable of functioning as a comparator after connecting with external components, such as resistors, capacitors. The comparators are capable of comparing a voltage signal detected from the AC source with two different voltage thresholds (2.5V, 160V) respectively. If the voltage signal of the AC source exceeds a first voltage threshold 2.5V, a first output terminal of the AC source detection circuit 380 outputs a high level (logic "1") signal to a pin P1.3 of the MCU 310 to inform the MCU 310 that the AC source supplied to the PSU 200 is switched on; otherwise, the first output terminal the AC source detection circuit 380 outputs a low level (logic "0") signal to the pin P1.3 of the MCU 310.

If the voltage signal of the AC source is less than 160V (such as 90V or 115V), the second output terminal of the AC source detection circuit 380 outputs a low level (logic "0") signal to the MCU 310 to inform the MCU 310 that the voltage of the AC source is at the first high level. If the voltage signal of the AC source exceeds a second voltage threshold 160V (such as 264V or 230V), a second output terminal of the AC source detection circuit 380 outputs a high level (logic "1") signal to a pin P1.0 of the MCU 310 to inform the MCU 310 that the voltage of the AC source applied to the PSU 200 is at the second high level.

An input terminal of the AC voltage level switch circuit 320 is connected to a pin P1.2 of the MCU 310. The AC voltage level switch circuit 320 includes a first relay controlled by the MCU 310. The first relay includes a first metal core 324 and a first switch 322. If the voltage of the AC source is at the first high level (90V or 115V), the switch 322 is in an on state for facilitating the PSU 200 to operate at a first voltage level mode. If the voltage of AC source is at the second high level (264V or 230V), the switch 322 is at an original off state for enabling the PSU 200 to operate at a second voltage level mode. The PSU 200 can operate at the first voltage level mode or the second voltage level mode to adapt for different external AC sources (such as 110V, or 220V).

An input terminal of the AC On/Off switch circuit 330 is connected to a pin P1.1 of the MCU 310. The AC On/Off switch circuit 330 includes a second relay controlled by the MCU 310. The second relay includes a second metal core 334 and a second switch 332. The second switch 332 is selectively switched On and switched Off according to the programs in the MCU 310 for connecting and disconnecting the AC source supplied to the PSU 200 correspondingly, thereby performing an AC On/Off test on the PSU 200.

An input terminal of the PSON signal switch circuit 340 is connected to a pin P1.4 of the MCU 310. The PSON signal switch circuit 340 includes a third relay controlled by the MCU 310. The third relay includes a third metal core 344 and a third switch 342. The third switch 342 is automatically switched on/off according to the programs in the MCU 310 for correspondingly powering on/off the PSU 200 using the PSON signal applied to the PSU 200.

An input terminal of the fan switch circuit 350 is connected to a pin P1.6 of the MCU 310. The fan switch circuit 350 includes a fourth relay controlled by the MCU 310. The fourth relay includes a fourth metal core 354 and a fourth switch 352. The fourth switch 352 is automatically switched on/off according to configurations in the MCU 310 that cools the PSU 200 when performing the normal test item or facilitates increasing ambient temperature when performing the OTP test procedure.

The alarm circuit 360 includes a speaker 362 controlled by a signal sent from a pin P2.7 of the MCU 310. The speaker 362 outputs out an audible alarm when error occurs during testing the PSU 200 or when the test has completed.

Figure 5:
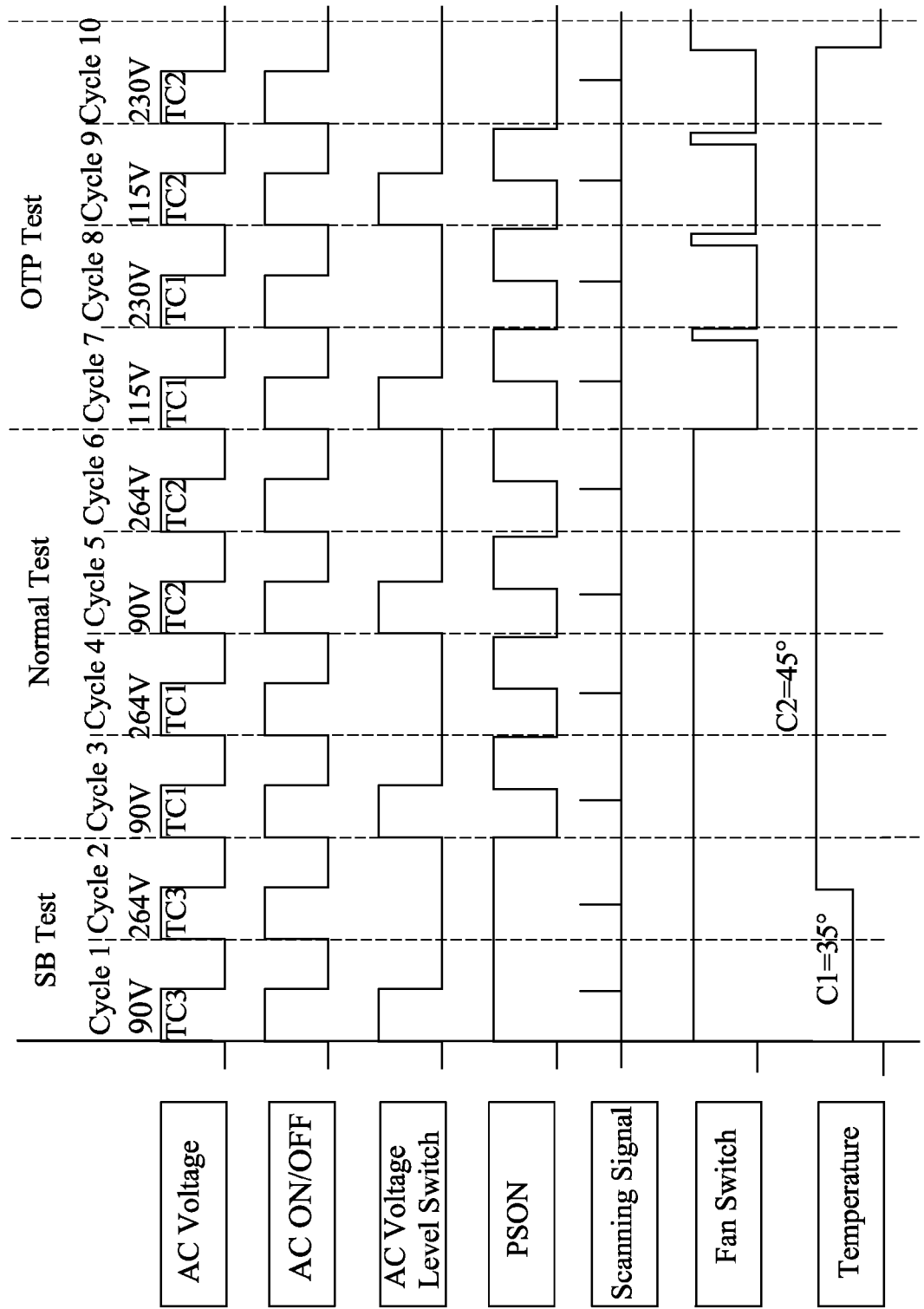
FIG. 5 is a timing chart of the test system in FIG. 1.

The scanning signal sending circuit 370 is connected to a pin P1.7 of the MCU 310 for sending a scan signal to the test sub-system 100 in each cycle of the test items (see FIG. 5). In each of the cycles, the test sub-system 100 records test data once in receipt of the scanning signal.

The clock signal generating circuit 390 includes a clock signal generating chip 392 and a second chip 394. The second chip 394 is an LM358 chip and includes two integrated amplifiers. A clock signal generated by the clock generating chip 392 is amplified by one of the amplifiers of the second chip 394 and sent to a CLK pin of the MCU 310. A power good (PG) signal from the PSU 200 is amplified by another amplifier of the second chip 394 and sent to a pin P1.5 of the MCU 310.

The MCU 310 is further connected to a selection circuit 312 for selecting a first test procedure or a second test procedure. The selection circuit 312 includes a selection switch 314. If the selection switch 314 is switched on, a signal on a pin P2.1 of the MCU 310 is grounded, and the first test procedure is performed; otherwise, the second test procedure is selected to be executed. The first specification specifies that the SB test item requires two clock cycles, the normal test item requires four clock cycles, and the OPT test item requires four clock cycles (10 cycles in total, see FIG. 5). A time period of each of the cycles is one hour. Thus, a total time period for executing the test under the first test procedure is 10 hours. The second specification specifies that the SB test item has three cycles, the normal test item has six cycles, and the OPT test item has six cycles (15 cycles in total). A total time of executing the test under the second test procedure is 15 hours.

Referring also to FIG. 5, during testing the PSU 200, the AC voltage of the AC source fed to the PSU 200 is switched on/off and switched from a first high level to a second high level periodically. The AC On/Off signal is at a high level if the AC voltage is at the first or second high level state, and at a low level (logic 0) if the AC voltage is at low level. If the AC voltage is at the first high level state (90V or 115V), an AC voltage level switch signal from the AC voltage level switch circuit 320 is switched to high level for invoking/facilitating the PSU 200 to operate under the first voltage level mode complying with the first high level AC voltage, and retains at low level for enabling the PSU 200 operating at the second voltage level mode complying with the second high level AC voltage. The PSON signal from the PSON signal switch circuit 340 remains high while performing the SB test item, thereby keeping the PSU 200 in the standby state if the AC voltage is at high level and detecting a standby signal of the PSU 200. The scanning signal from the scanning signal sending circuit 370 includes a pulse in each of the cycles. The fan switch signal from the fan switch circuit 350 is at a high level during executing the SB test item and the normal test item, and periodically switched to low level to shut down the fan of the PSU 200, thereby providing an increasingly high temperature to the PSU 200 during executing the OPT test item. A temperature signal is switched from 35° C. to 45° C. for providing a required ambient temperature to test the PSU 200. The temperature signal is provided by the chamber (not shown) of the test sub-system 100. The PSU 200 is capable of being accommodated in the chamber.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A system for testing a power supply unit comprising:
a test sub-system for performing test and recording test results; and
a test control sub-system connected to the test sub-system and the power supply unit, the test control sub-system capable of selecting test items to test the power supply unit and setting an execution sequence of the test items; wherein the test items comprises a standby test item for testing the power supply unit at a standby state, a normal test item for testing the power supply unit at a normal state, and an over temperature protection test item for testing the power supply unit at an over heated state; the test control sub-system is capable of automatically switching the standby test item to the normal test item after a first predetermined time period for executing the standby test item, and switching the normal test item to the over temperature protection test item after a second predetermined time period for executing the normal test item; wherein the test control sub-system comprises a fan switch circuit for switching on or off a fan of the power supply unit thereby enabling the power supply unit at the over heated state during executing the over temperature protection test item; the test control subsystem further comprises a microcontroller unit connected to the test sub-system and the power supply unit, and a Power supply unit On (PSON) signal switch circuit connected to the microcontroller unit, the PSON signal switch circuit is controlled by the microcontroller unit and configured to switch a PSON signal on the power supply unit between a low level and a high level.

2. The system as described in claim 1, wherein the test control sub-system further comprises an alternating current (AC) voltage level switch circuit connected to the microcontroller unit, the AC voltage level switch circuit comprises a first switch member controlled by the microcontroller unit for enabling the power supply unit to be operated at a voltage level mode complying with a voltage level of the AC source supplied to the power supply unit.

3. The system as described in claim 1, wherein the test control sub-system further comprises an AC On/Off switch circuit connected to the microcontroller unit, the AC On/Off switch circuit comprises a second switch member controlled by the microcontroller unit and configured to switch on or off an AC source fed to the power supply unit.

4. The system as described in claim 1, wherein the test control sub-system further comprises an alarm circuit connected to the microcontroller unit, the alarm circuit includes a speaker capable of sending out an alarming signal when the test ends or an error occurs during testing the power supply unit.

5. The system as described in claim 1, wherein the test control sub-system further comprises a scanning signal sending circuit connected to the microcontroller unit for outputting a scanning signal to the test sub-system for recording test data periodically.

6. The system as described in claim 1, wherein the test control sub-system further comprises an AC source detection circuit connected to the microcontroller unit, the AC source detection circuit is capable of sending an AC On/Off signal and an AC voltage level signal to the microcontroller unit to inform the microcontroller unit whether the AC source is switched on/off and whether the AC voltage is at a second high level or a second high level.

7. The system as described in claim 1, wherein the test control sub-system further comprises a clock signal generating circuit connected to the microcontroller unit for providing a precise clock signal to the microcontroller unit, a power good signal of the power supply unit is amplified by an amplifier of the clock signal generating circuit and sent to the microcontroller unit.

8. The system as described in claim 1, wherein a selection switch is connected to the microcontroller unit for selecting a first test procedure or a second test procedure to test the power supply unit; when the first test procedure is selected to test the power supply unit, cycle numbers of the test items is ten; and when the second test procedure is selected to test the power supply unit, cycles numbers of the test items is fifteen.

9. A system for testing a power supply unit comprising:
a test sub-system connected to the power supply unit; and
a test control sub-system coupled to the test sub-system and the power supply unit, the test control sub-system comprising a microcontroller unit capable of automatically switching On/Off an AC source applied to the power supply unit, switching On/Off a Power supply unit On (PSON) signal fed to the power supply unit, and switching On/Off a fan of the power supply unit for providing a normal and an overheated environment to the power supply unit.

10. The system as described in claim 9, wherein an AC source detection circuit is connected to the microcontroller unit for informing the microcontroller unit whether the AC source is switched on or off and whether a voltage level of the AC source fed to the power supply unit is at a first high level or a second high level.

11. The system as described in claim 10, wherein the AC source detection circuit comprises a first chip capable of comparing a signal detected from the AC source with a first threshold voltage or a second threshold voltage to determine whether the AC source is switched on or off and determine whether the voltage level of the AC source fed to the power supply unit is at the first high level or the second high level.

12. The system as described in claim 11, wherein the first threshold voltage is 2.5V, and the second threshold is 160V; if a voltage of the detected AC signal is greater than 4V, a first output terminal of the AC source detection circuit is capable of sending a high level signal to the microcontroller unit to inform the microcontroller unit the AC source is switched on; if the AC source is switched on, and the voltage of the detected AC signal does not exceed 160V, a second output terminal of the AC source detection circuit is capable of sending a low level signal to the microcontroller unit to inform the microcontroller unit that the AC source is at the first high level;
if the voltage of the detected AC signal exceeds 160V, the second output terminal of the AC source detection circuit is capable of sending a high level signal to the microcontroller unit to inform the microcontroller unit that the AC source is at the second high level.

13. The system as described in claim 11, wherein an AC voltage level switch circuit is connected to the microcontroller unit and comprises a switch member controlled by the microcontroller unit, the switching member is switched on if the AC source is detected at the second high level.

14. The system as described in claim 9, wherein a clock signal generating circuit is connected to the microcontroller unit for providing a precise clock signal to the microcontroller unit, the clock signal generating circuit comprises a chip capable of amplifying a power good signal of the power supply unit and sending the amplified power good signal to the microcontroller unit.

15. The system as described in claim 9, wherein the test control sub-system further comprises an alarm circuit connected to the microcontroller unit, the alarm circuit comprises a speaker capable of sending out an alarming signal when the test ends or an error occurs during testing the power supply unit.

16. The system as described in claim 9, wherein the test control sub-system further comprises a scanning signal sending circuit connected to the microcontroller unit for generating a scanning signal to the test sub-system for recording test data periodically.

17. The system as described in claim 9, wherein a selection switch is connected to the microcontroller unit for selecting a first test procedure or a second test procedure to test the power supply unit; if the first test procedure is selected to test the power supply unit, a total test period is 10 hours; and if the second test procedure is selected to test the power supply unit, a total test period is 15 hours.

* * * * *